(12) United States Patent
Miller et al.

(10) Patent No.: US 7,630,468 B2
(45) Date of Patent: Dec. 8, 2009

(54) DUAL-PLL SIGNALING FOR MAINTAINING SYNCHRONIZATION IN A COMMUNICATIONS SYSTEM

(75) Inventors: Kevin Miller, Lawrenceville, GA (US); Ray Whitehead, Suwannee, GA (US)

(73) Assignee: Broadcom Corporation, Irvine, CA (US)

( * ) Notice: Subject to any disclaimer, the term of this patent is extended or adjusted under 35 U.S.C. 154(b) by 717 days.

(21) Appl. No.: 10/967,201

(22) Filed: Oct. 19, 2004

(65) Prior Publication Data

US 2005/0135526 A1    Jun. 23, 2005

Related U.S. Application Data

(60) Provisional application No. 60/530,647, filed on Dec. 19, 2003.

(51) Int. Cl.
*H03D 3/24* (2006.01)
(52) U.S. Cl. ........................ 375/376; 327/147
(58) Field of Classification Search ......... 375/354–377; 327/147
See application file for complete search history.

(56) References Cited

U.S. PATENT DOCUMENTS

| | | | | |
|---|---|---|---|---|
| 5,652,532 | A * | 7/1997 | Yamaguchi | 327/39 |
| 5,856,762 | A * | 1/1999 | Werker et al. | 331/11 |
| 6,483,885 | B1 * | 11/2002 | Bradley et al. | 375/366 |
| 2002/0001359 | A1 * | 1/2002 | Skierszkan et al. | 375/355 |
| 2002/0027966 | A1 * | 3/2002 | Fukuhara | 375/376 |
| 2005/0111605 | A1 * | 5/2005 | Loke et al. | 375/375 |

* cited by examiner

*Primary Examiner*—Shuwang Liu
*Assistant Examiner*—James M Perez
(74) *Attorney, Agent, or Firm*—Sterne, Kessler, Goldstein & Fox, P.L.L.C.

(57) ABSTRACT

A communications management system introduces a low bandwidth phase locked loop (LoBW-PLL) working in tandem with a high bandwidth phase locked loop (HiBW-PLL). The LoBW-PLL only needs to follow the average frequency of the transported clock and not all of the excursions made by the master clock. During periods of downstream outage, the LoBW-PLL opens its loop and free wheels such that disturbances caused by a reacquisition do not impact the concept of time for the LoBW-PLL. After reacquisition, the LoBW-PLL and HiBW-PLL are compared to determine if a timing error has occurred. If a timing error is detected, the magnitude of the timing error is measured upon completion of the reacquisition cycle, and this measurement is used to correct the timing error.

16 Claims, 7 Drawing Sheets

DUAL-PLL SIGNALING FOR MAINTAINING SYNCHRONIZATION IN A COMMUNICATIONS SYSTEM

CROSS-REFERENCE TO RELATED APPLICATIONS

This application claims the benefit of U.S. Provisional Application No. 60/530,647, filed Dec. 19, 2003, by Miller et al., entitled "Dual-PLL Signaling for Maintaining Synchronization in a Communications System," incorporated herein by reference in its entirety.

BACKGROUND OF THE INVENTION

1. Field of the Invention

The present invention is directed to detecting signal errors and, more particularly, to measuring and correcting timing errors in a communications signal.

2. Related Art

In some communications networks, especially with a one-to-many arrangement, it is common for one end (e.g., head-end) to master the clocks used for communication functions such as symbol timing, carrier frequency, and burst timing. It is then the responsibility of a slave end to recover this clock from a transport medium, and use it for all channel timing variables. A difficulty arises if there are interruptions in the downstream traffic from the master, and therefore interruptions in the timing information that is carried in that downstream traffic. The slave will be asked to minimize any interruptions in upstream traffic as a result of this.

Normally, a phase locked loop (PLL) is used to recover and regenerate clocks at the slave based on the transported clock. This PLL needs to have a bandwidth that is wide enough to follow any excursions in frequency made by the master clock at the headend. The comparatively wide bandwidth necessitated on this PLL means that during periods of downstream outage, it can wander quickly away from the correct frequency such that by the time the outage terminates, the timing at the slave may have slipped many clock cycles away from the correct synchronization point. Even having the ability to open the feedback loop on this PLL does not obviate the problem, because the time needed to detect a loss of clock information is enough to cause this loop to misalign with correct timing.

Therefore, a need exists to develop a technology that addresses these concerns.

SUMMARY OF THE INVENTION

A communications management system is provided with the capability to detect, measure, and/or correct timing errors, such as a timing error induced by downtime in an upstream path caused by interruptions on a downstream path. A remote communications node (such as a cable modem), which is communicatively coupled to a supervisory communications node (such as a cable modem termination system (CMTS) for a headend controller), is equipped with two phase lock loops (PLLs). A low bandwidth PLL (LoBW-PLL) works in tandem with a high bandwidth PLL (HiBW-PLL) to quantify a clock difference between the two PLLs. The LoBW-PLL only needs to follow the average frequency of the transported clock and not the excursions made by the master clock.

Upon detection of a downstream outage, an acquisition control signal is asserted to initiate an acquisition cycle. The LoBW-PLL opens its loop and free wheels such that disturbances caused by reacquisition do not impact the concept of time for the LoBW-PLL. During the acquisition cycle, the LoBW-PLL and HiBW-PLL are compared to determine if a timing error has occurred. If a timing error is detected, the magnitude of the timing error is measured upon completion of the acquisition cycle. Thereafter, this measurement can be used to correct the timing error such that the clock outage event can be completely mitigated.

In one embodiment, the LoBW-PLL and HiBW-PLL are compared to produce a series of clock difference values. A base clock difference value is produced at the beginning of the acquisition cycle, and a final clock difference value is produced upon completion of the acquisition cycle. A substantial difference between the base and final clock difference values indicates a timing error. A timing difference value is computed from the base and final clock difference values. The timing difference value is directly proportional to the base and final clock difference values, and is subtracted from, for example, the modules that control symbol and burst timing such that the clock outage event can be completely mitigated.

DETAILED DESCRIPTION OF THE INVENTION

In an embodiment of the present invention, a communications management system is provided with the capability to detect, measure, and/or correct timing errors, such as a timing error induced by downtime in an upstream path caused by interruptions on a downstream path. The communications management system includes two phase lock loops (PLLs). A low bandwidth phase locked loop (LoBW-PLL) works in tandem with a high bandwidth PLL (HiBW-PLL) to quantify a clock difference between the two PLLs. As described below, the clock difference serves as an indicator for detecting, measuring, and/or correcting timing errors.

Figure 1:
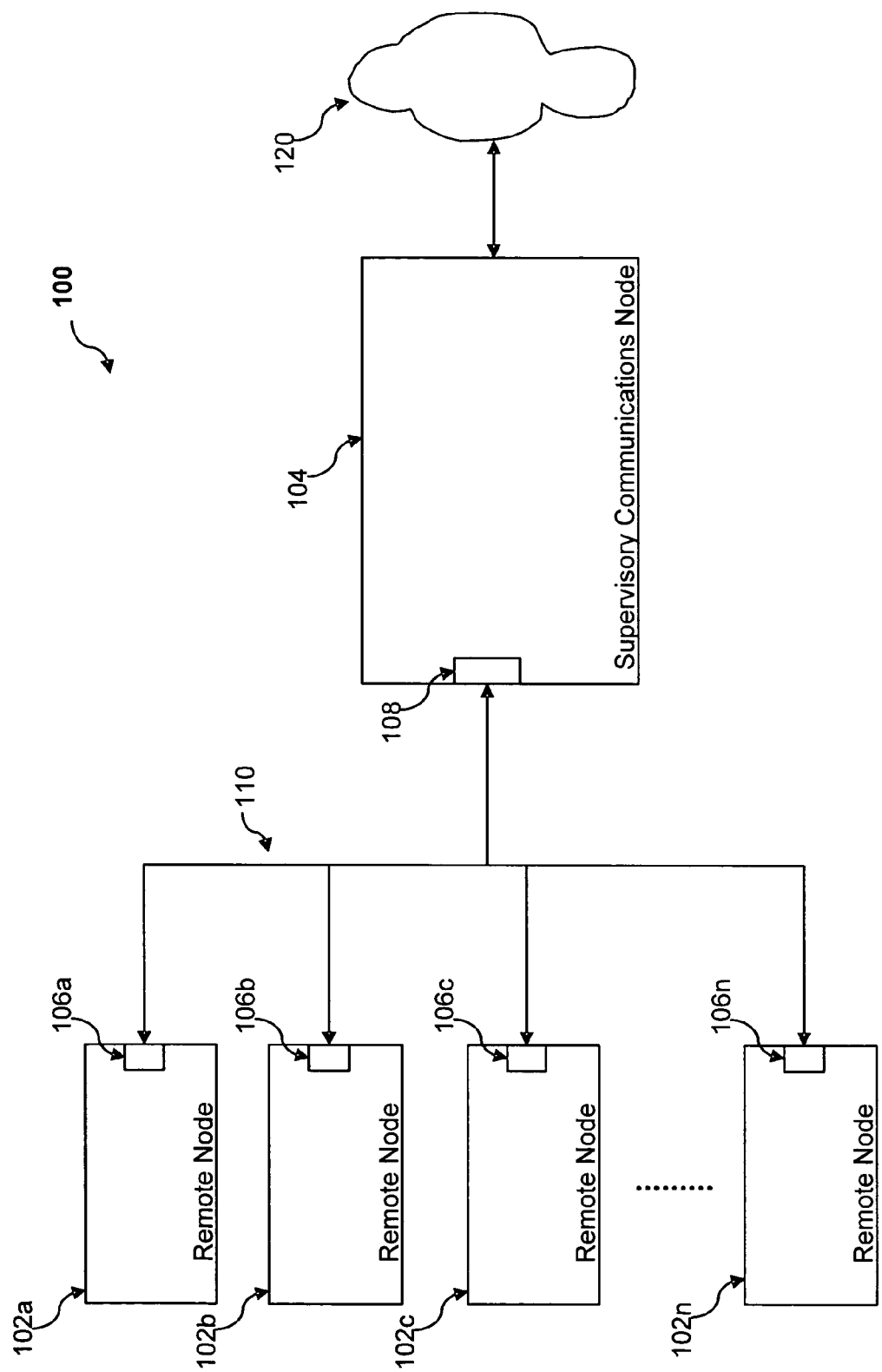
FIG. 1 illustrates a communications management system according to an embodiment of the present invention.

FIG. 1 illustrates a communications management system 100. Communications management system 100 includes a supervisory communications node 104 and one or more widely distributed remote communications nodes 102a-102n (collectively referred to as "remote communications nodes 102"). Communications management system 100 can be implemented in any multimedia distribution network. Furthermore, it should be understood that communications management system 100 manages the exchange of voice, data, video, audio, messaging, graphics, other forms of media and/or multimedia, or any combination thereof.

Supervisory communications node 104 is centrally positioned to command and control interactions with and among remote communications nodes 102. Supervisory communications node 104 manages upstream modulation and arbitrates bandwidth among remote communications nodes 102. Supervisory communications node 104 establishes the upstream slot structure and allocates upstream bandwidth by sending, for example, an upstream channel descriptor (UCD) message and MAP messages, respectively, to remote communications nodes 102. Supervisory communications node 104 also uses the MAP messages and slot count values to anticipate burst arrivals from remote communications nodes 102. The UCD and MAP messages may be defined by the CableLabs® Certified™ Cable Modem project (formerly known as Data Over Cable Service Interface Specification (DOCSIS™)), which specifies the interface requirements for cable communications systems.

Supervisory communications node 104 is a component of a headend controller for a cable communications network. As such, supervisory communication node 104 is a CMTS or a part thereof. In one embodiment, at least one remote communications node 102 is a cable modem or a part thereof. In another embodiment, supervisory communications node 104 is a CMTS and at least one remote communications node 102 is part of a television set-top box. As part of a cable modem, remote communications node 102 is configurable to transport one or more services to a subscriber. The services include telephony, television broadcasts, pay-for-view, Internet communications (e.g., WWW), radio broadcasts, facsimile, file data transfer, electronic mailing services (email), messaging, video conferencing, live or time-delayed media feeds (such as, speeches, debates, presentations, infomercials, news reports, sporting events, concerts, etc.), and/or the like.

Communications management system 100 also includes an internodal infrastructure 110. As shown in FIG. 1, internodal infrastructure 110 provides interconnectivity among supervisory communications node 104 and remote communications nodes 102. Internodal infrastructure 110 supports wired, wireless, or both transmission media, including satellite, terrestrial (e.g., fiber optic, copper, twisted pair, coaxial, hybrid fiber-coaxial (HFC), or the like), radio, microwave, free-space optics, and/or any other form or method of transmission.

All communications transmitted in the direction from supervisory communications node 104 towards remote communications nodes 102 are referred to as being in the downstream. The downstream may be divided into one or more downstream channels. Each downstream channel is configured to carry various types of information to remote communications nodes 102. Such downstream information includes television signals, data packets (IP datagrams), voice packets, control messages, and/or the like. The downstream may be formatted with a motion picture expert group (MPEG) transmission convergence sublayer. However, the present invention can be configured to support other data formats as would be apparent to one skilled in the relevant art(s).

The upstream represents all communications from remote communications nodes 102 towards supervisory communications node 106. The upstream is divided into one or more upstream channels. Each upstream channel carries bursts of packets from remote communications nodes 102 to supervisory communications node 104. In the upstream, each channel is broken into multiple assignable slots, and remote communications nodes 102 send a burst signal in an assigned slot. As discussed above, the slot structure is defined and assigned by supervisory communications node 104.

Backbone network 120 is part of a wired, wireless, or combination of wired and wireless local area networks (LAN), wide area networks (WAN), and/or optical networks (such as, an organization's intranet, local internets, the global-based Internet (including the World Wide Web (WWW)), virtual private networks, and/or the like). As such, supervisory communications node 104 utilizes backbone network 120 to communicate with another device or application external to communications management system 100. The device or application can be a server, web browser, operating system, other types of information processing software (such as, word processing, spreadsheets, financial management, or the like), television or radio transmitter, another remote communications node 102, another supervisory communications node 104, or the like.

Supervisory communications node 104 and remote communications nodes 102 may be integrated to support protocols such as Internet Protocol (IP), Transmission Control Protocol (TCP), User Datagram Protocol (UDP), Real Time Transport Protocol (RTP), Resource Reservation Protocol (RSVP), or the like.

Referring to FIG. 1, each remote communication node 102 includes a timing error detection and measurement module 106 (shown as timing modules 106a-106n, which are collectively referred to as "timing modules 106"). Supervisory communications node 104 also includes a timing module 108. Timing module 108 masters the clocks of remote communications nodes 102a-102n by sending a clock transport quantity in the downstream of internodal infrastructure 110. Remote communications nodes 102a-102n recover the clock transport quantity from the downstream, and their respective timing modules 106 use the clock transport quantity for channel timing variables. As discussed above, the present invention includes techniques and/or methodologies for enabling each timing module 106 to detect, measure, and/or correct timing errors, such as errors caused by an interruption in receiving the clock transport quantity.

Figure 2:
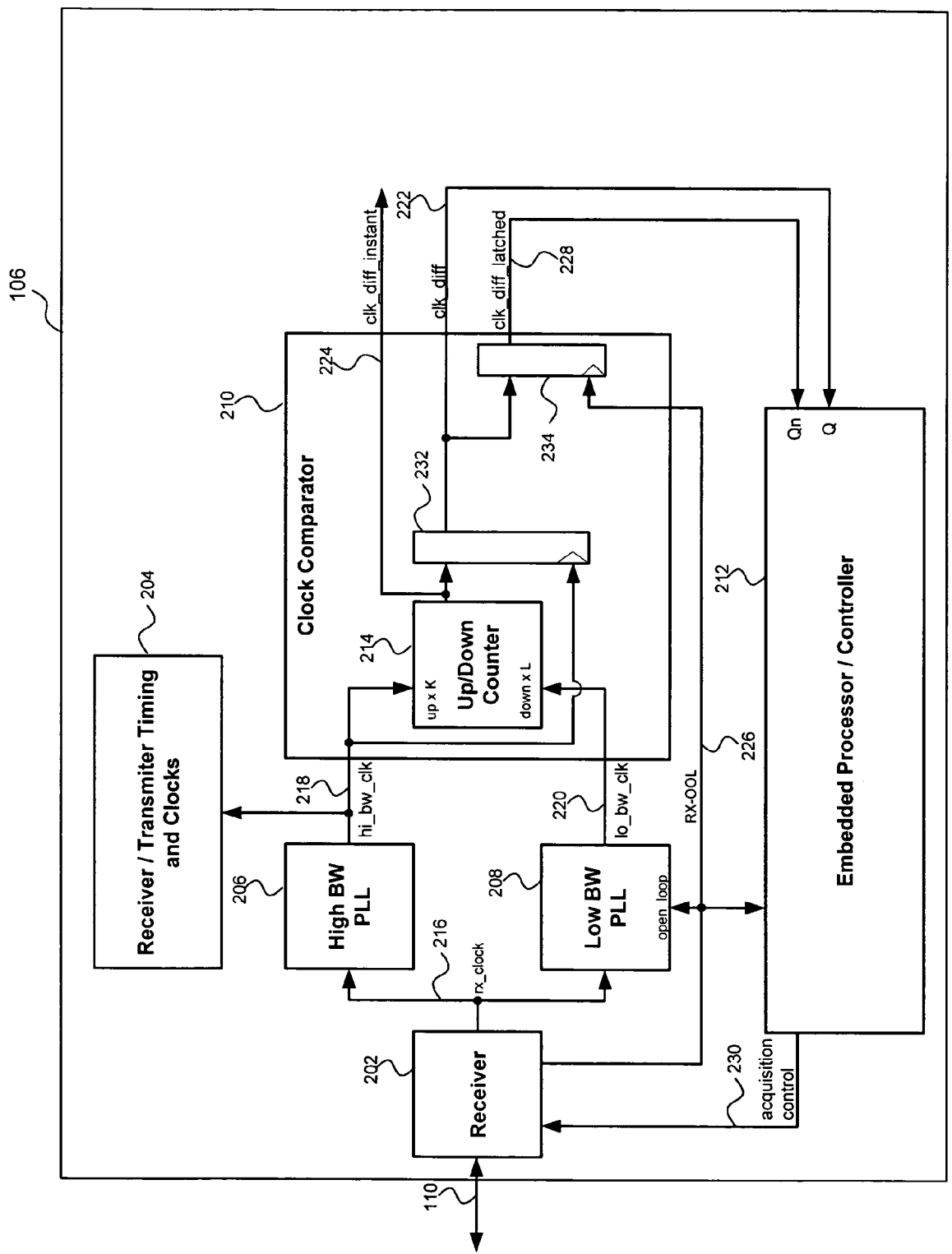
FIG. 2 illustrates a timing error detection and measurement module.

FIG. 2 illustrates several components of timing module 106. Timing module 106 includes a receiver 202, one or more receiver/transmitter timing and clocks 204, a low bandwidth PLL (LoBW-PLL) 208, a high bandwidth PLL (HiBW-PLL) 206, a clock comparator circuit 210, and an embedded processor/controller 212.

Receiver 202 demodulates the downstream of internodal infrastructure 110, and parses out the appropriate clock transport quantity. The clock transport quantity can be the symbol clock, the carrier frequency, or other indicators such as a message based timestamp, or the like. In FIG. 2, the clock transport quantity 216 is labeled as "rx_clock" and is provided to HiBW-PLL 206 and LoBW-PLL 208.

HiBW-PLL 206 regenerates a high bandwidth clock 218 that mimics the master clock (from timing module 108) at supervisory communications node 104. High bandwidth clock 218 is passed to receiver/transmitter timing and clocks 204 and clock comparator 210. High bandwidth clock 218 is used for all timing information related to upstream communications over internodal infrastructure 110. Such timing information includes the carrier frequency, symbol timing, burst timing, and/or the like.

LoBW-PLL 208 recovers a low bandwidth clock 220 from rx_clock 216. Low bandwidth clock 220 is also passed to clock comparator circuit 210. The frequency of low bandwidth clock 220 and the frequency of high bandwidth clock 218 do not need to be the same, and in fact, it is useful to use a high frequency clock from LoBW-PLL 208 to provide small time resolution within clock comparator 210. LoBW-PLL 208 only needs to follow the average frequency of the transported clock and not the excursions made by the master clock (i.e., timing module 108).

Clock comparator 210 quantifies a clock difference 222 from high bandwidth clock 218 and low bandwidth clock 220. As described below, clock difference 220 serves as an indicator for detecting, measuring, and/or correcting timing errors. As shown, clock comparator 210 includes an up/down counter 214, a register 232, and a register 234. Up/down counter 214 receives high bandwidth clock 218 and low bandwidth clock 220, and outputs clock difference 222 and a clock difference instant 224.

Register 232 stores clock difference 222. Upon receipt of a new clock (via high bandwidth clock 218), register 232 releases the stored value of clock difference 222 and, thereafter, stores the next value of clock difference 222, which results from the new clock 218. When released from register 232, clock difference 222 is passed to embedded processor/controller 212.

Register 234 stores each clock difference 222 that is released from register 232. Upon receipt of a subsequent clock difference 222, register 234 discards the previous clock difference 222. When register 234 receives a signal 226 (shown as "RX_OOL") from receiver 202, register 234 latches the currently stored clock difference 222 to produce a clock difference latched value 228. Clock difference latched value 228 is passed to embedded processor/controller 212.

Embedded processor/controller 212 receives clock difference 222 and clock difference latched value 228 from clock comparator 210. During a downstream clock outage, embedded processor/controller 212 receives signal RX_OOL 226 from receiver 202 and initiates an acquisition cycle by asserting an acquisition control signal 230.

The present invention includes methodologies and/or techniques for implementing a task in embedded processor/controller 212 to correct timing errors that are measured from the output (e.g., clock difference 222 and clock difference latched value 228) of clock comparator 210. Clock comparator 210 quantifies the relationship of high bandwidth clock 218 to low bandwidth clock 222, such that the output provides an indication of whether the two loops are locked. Up/down counter 214 quantifies this relationship by executing a "count up by K and count down by L" process that produces a zero balance when both loops are locked. This can be explained with reference to FIGS. 3-5.

Figure 3:
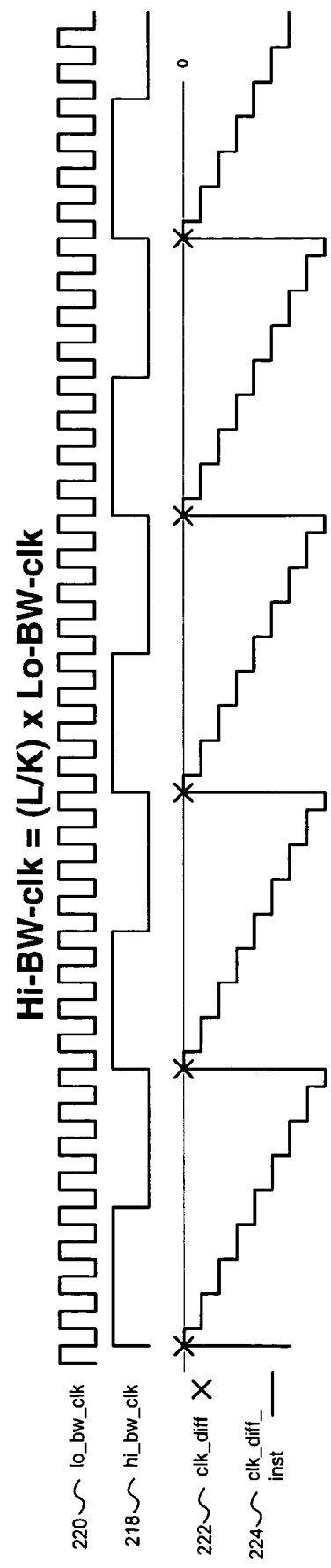
FIG. 3 illustrates a timing diagram of a clock comparator having two loops locked.

FIG. 3 illustrates a timing diagram of clock comparator 210, which indicates that both loops are locked. The loops are determined to be locked when the logical expression "Hi-BW-clk=(L/K)×Lo-BW-clk" is true. As can be noted, high bandwidth clock 218 and low bandwidth clock 220 are related by the ratio "L/K." In FIG. 2, the countdown value L is "1" and the count-up value K is "8," which results in a decrement of one and an increment of eight. The output (i.e., clock difference 222) of up/down counter 214 is registered (at register 232) on every rising edge of the high bandwidth clock 218 in order to avoid catching a value after several decrements have occurred. As can be seen, clock difference instant 224 decrements on the rising edge of low bandwidth clock 220 and increments on the rising edge of high bandwidth clock 218. When the clocks (i.e., high bandwidth clock 218 and low bandwidth clock 220) are locked, the value of clock difference 222, which is released from register 232, should read zero.

Figure 4:
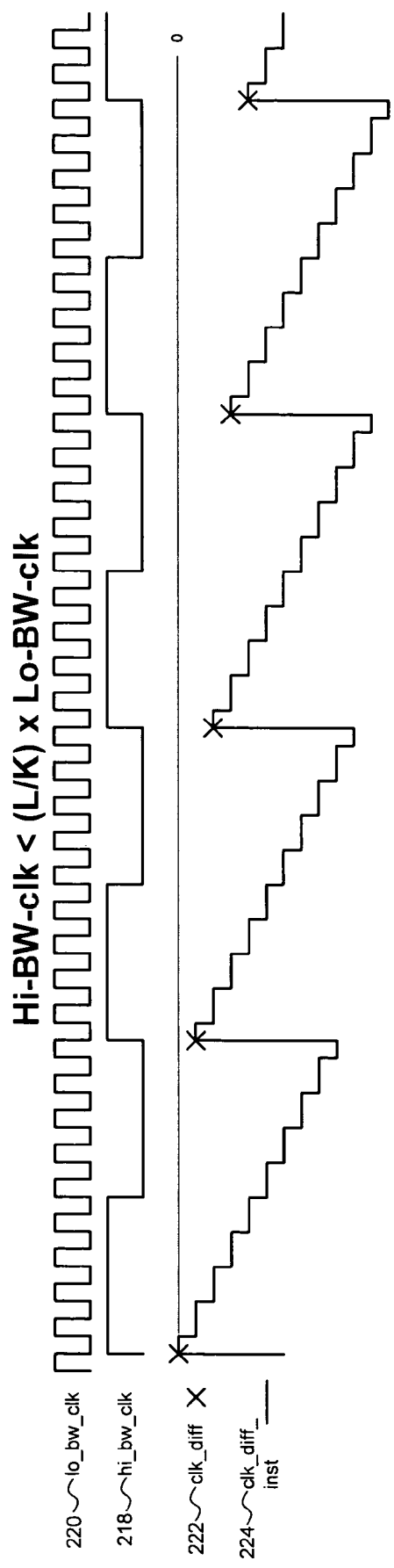
FIG. 4 illustrates a timing diagram of a clock comparator having two unlocked loops, where the HiBW clock is higher in frequency that the LoBW clock.
Figure 5:
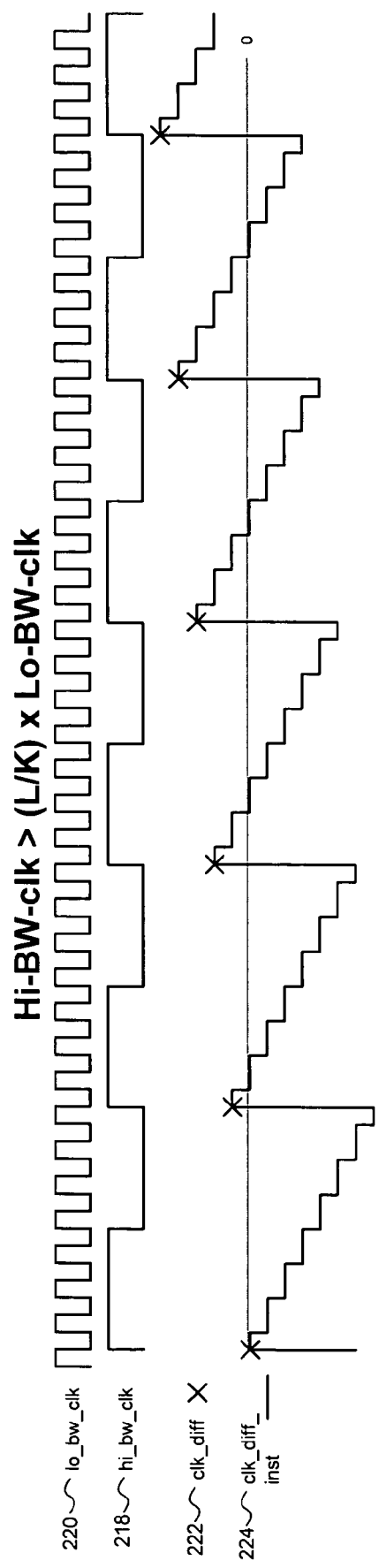
FIG. 5 illustrates a timing diagram of a clock comparator having two unlocked loops, where the HiBW clock is lower in frequency than the LoBW clock.

FIG. 4 and FIG. 5 each illustrate a timing diagram of clock comparator 210, which indicates that both loops are unlocked. As shown, the loops are determined to be unlocked when high bandwidth clock 218 and low bandwidth clock 220 deviate slightly from the above-mentioned ratio of "L/K", and therefore, the logical expression "Hi-BW-clk=(L/K)×Lo-BW-clk" is determined to be false.

In FIG. 4, the registered value (i.e., clock difference 222) follows a trajectory that is constantly decreasing if high bandwidth clock 218 is too low in frequency. In FIG. 5, the registered value (i.e., clock difference 222) follows a trajectory that is constantly increasing if high bandwidth clock 218 is too high in frequency. As can be seen, reading the value of the registered clock difference 222 indicates in real time how the two loops differ in their respective concepts of time.

Figure 6:
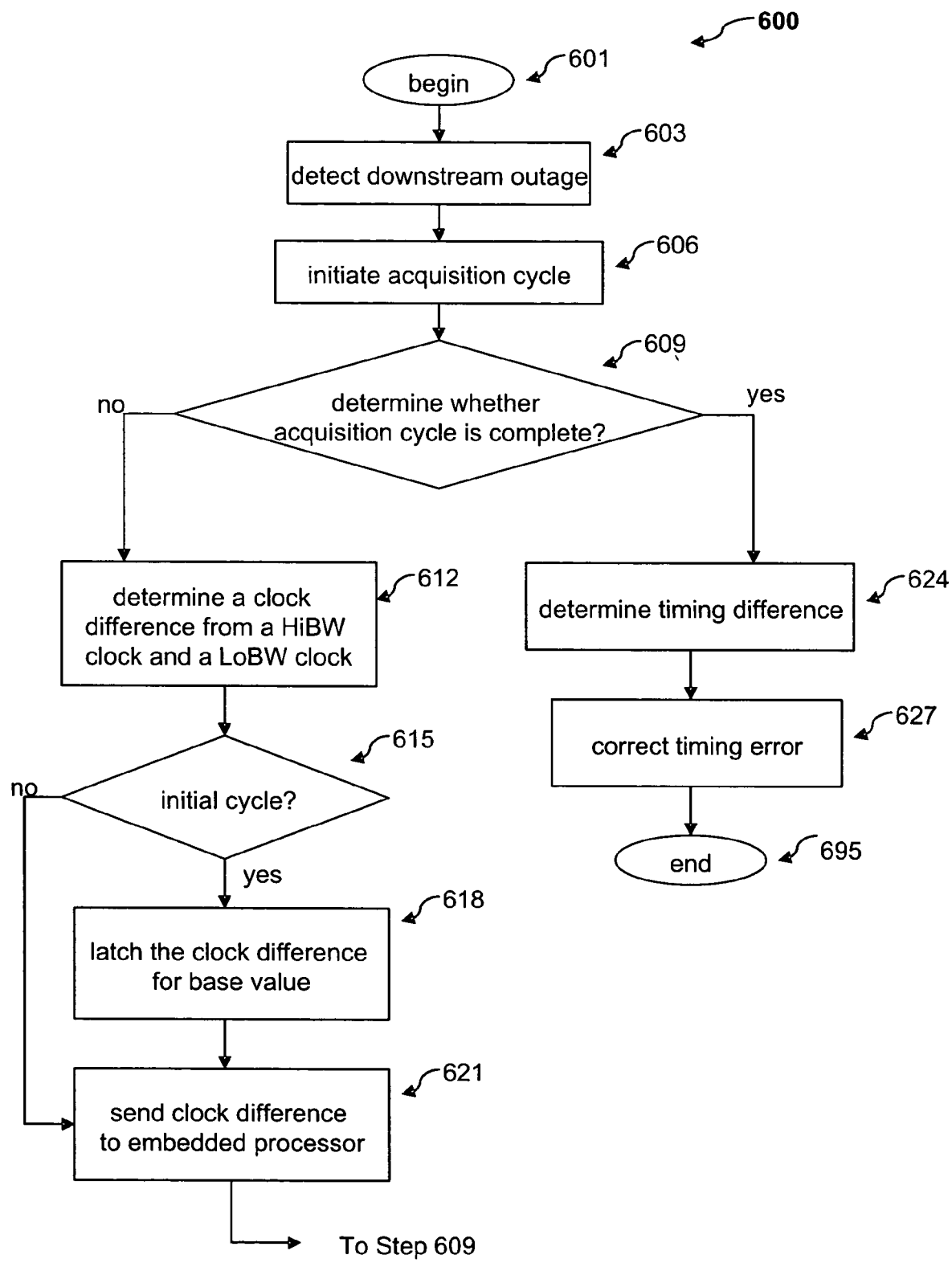
FIG. 6 illustrates an operational flow for correcting a timing error.

Referring to FIG. 6, flowchart 600 illustrates the general operational flow of the system. More specifically, flowchart 600 shows an example of a control flow for detecting, measuring, and/or correcting timing errors in a communications management system.

The control flow of flowchart 600 begins at step 601 and passes immediately to step 603. At step 603, a downstream outage is detected by a remote communications node 102. At step 606, an acquisition cycle is initiated to recover a clock transport quantity from the downstream. Referring back to FIG. 2, in an embodiment when receiver 202 determines that it has lost clock transport information on the downstream, receiver 202 asserts the indicator RX_OOL 226, which is sent to LoBW-PLL 208, embedded processor controller 212, and register 234. RX_OOL 226 opens the loop on LoBW-PLL 208 and instructs embedded processor/controller 212 to start an acquisition cycle.

Referring back to FIG. 6 at step 609, the control flow passes immediately to step 612 since the acquisition cycle is being initiated. At step 612, up/down counter 214 outputs clock difference 222. At step 615, the control flow passes immediately to step 618 since this is the initial cycle following the initiation of the acquisition cycle.

Figure 7:
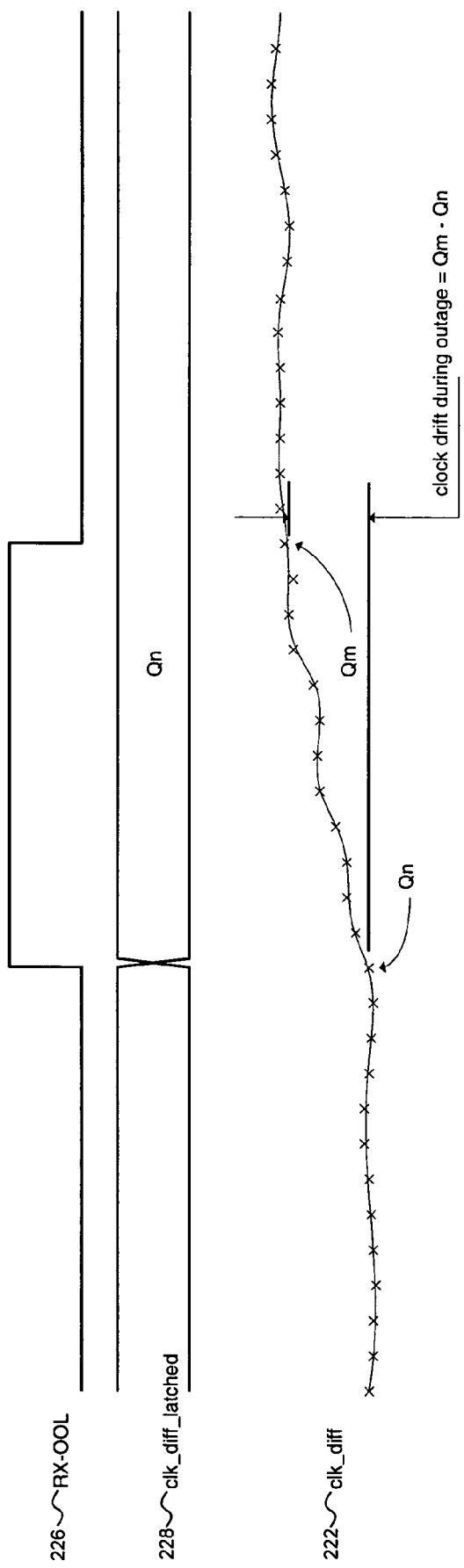
FIG. 7 illustrates a timing diagram depicting a lost clock transport.

At step 618, register 234 receives RX_OOL 226 and latches the current value of clock difference 222 to produce clock difference latched value 228. FIG. 7 illustrates a timing diagram of this event, according to an embodiment of the present invention. As shown, the downstream outage is indicated by the assertion of RX_OOL 226, which causes clock difference latched value 228 to take on the last known good value of clock difference 222 (shown as "Qn").

Referring back to step 621, clock difference latched value 228 is passed to embedded processor/controller 212. Clock difference latched value 228 serves as a base value (Qn) for further processing, as described below.

Upon completion of step 621, the control flow returns to step 609 where it is determined whether the acquisition cycle has completed. If not, the control flow passes to step 612 and the next clock difference 222 is output from up/down counter 214. Step 615 is skipped since it is no longer the initial cycle, and at step 621, clock difference 222 (shown in FIG. 2 as "Q") is passed to embedded processor/controller 212.

If at step 609, it is determined that the acquisition cycle has been completed, the control flow passes to step 624. As such, the value of clock difference 222 (shown in FIG. 2 as "Q") can continue to grow either negatively or positively until the reacquisition completes, as indicated in FIG. 7 by RX_OOL 226 being de-asserted.

At step 624, it is determined whether the clocks (i.e., the clocks from timing module 108 and timing module 106) have drifted during the acquisition cycle. Referring back to FIG. 7, when RX_OOL 226 is de-asserted, the clock difference 222 passed to processor embedded/controller 212 is denoted as "Qm". Any difference between the value "Qm" and the base value "Qn" is a measure of the clock drift.

The clock drift (i.e., "Qm−Qn") is used to determine a timing difference value. The timing difference is also measured in units of periods of low bandwidth clock 220. If low bandwidth clock 220 is a high frequency clock, then the resolution in time can be made appropriately small. The timing difference may be determined by Equation A:

$$\text{Time}Diff = Qm - Qn/freq\_low\_bw\_clk \quad \text{EQUATION A}$$

In Equation A, "freq_low_bw_clk" refers to the frequency of the low bandwidth clock 220 coming out of the LoBW-PLL 208.

Once the timing difference has been resolved into absolute units of time, at step 627, the timing difference is used as a correction to timing errors, in, for example, symbol timing, burst timing, and/or the like. Symbol timing and burst timing may be kept in real time using Numerically Controlled Oscillators (NCOs). Adding an offset into the respective accumulators of the NCOs associated with, for example, symbol timing and burst timing allows for the timing error to be completely corrected. Upon detection, measurement, and/or correction of the timing error, the control flow ends as indicated by step 695.

As discussed above, the present invention provides an indicator of when there is a timing error, the magnitude of the error, and a quantity that can be used to correct for the error. It should be noted that, by having two PLL's (i.e., HiBW-PLL 206 and LoBW-PLL 208), there is no need to compromise the bandwidth on the main clock regenerator. It can be chosen to best follow the headend clock (e.g., timing module 108).

FIGS. 1-7 are conceptual illustrations allowing an easy explanation of the present invention. It should be understood that embodiments of the present invention could be implemented in hardware, firmware, software, or a combination thereof. In such an embodiment, the various components and steps would be implemented in hardware, firmware, and/or software to perform the functions of the present invention. That is, the same piece of hardware, firmware, or module of software could perform one or more of the illustrated blocks (i.e., components or steps).

In this document, the terms "computer program medium" and "computer usable medium" are used to generally refer to media such as a removable storage unit, a hard disk installed in hard disk drive, and signals (i.e., electronic, electromagnetic, optical, or other types of signals capable of being received by a communications interface). These computer program products are means for providing software to a computer system. The invention, in an embodiment, is directed to such computer program products.

In an embodiment where aspects of the present invention are implemented using software, the software can be stored in a computer program product and loaded into computer system using a removable storage drive, hard drive, or communications interface. The control logic (software), when executed by a processor, causes the processor to perform the functions of the invention as described herein.

In another embodiment, aspects of the present invention are implemented primarily in hardware using, for example, hardware components such as an application specific integrated circuit (ASIC), hardware assist devices such as a field-programmable gate array (FPGA), or the like. Implementation of the hardware state machine so as to perform the functions described herein will be apparent to one skilled in the relevant art(s).

In yet another embodiment, the invention is implemented using a combination of both hardware and software.

While various embodiments of the present invention have been described above, it should be understood that they have been presented by way of example, and not limitation. It will be apparent to one skilled in the relevant art(s) that various changes in form and detail can be made therein without departing from the spirit and scope of the invention. Moreover, it should be understood that the method, system, and computer program product of the present invention could be implemented in any multi-nodal communications environment governed by a centralized node(s). The nodes include, but are not limited to, cable modems, set-top boxes, and headends, as well as communication gateways, switches, routers, Internet access facilities, servers, personal computers, enhanced telephones, personal digital assistants (PDA), televisions, or the like. Thus, the present invention should not be limited by any of the above-described exemplary embodiments, but should be defined only in accordance with the following claims and their equivalents.

What is claimed is:

1. A method of correcting a timing error within a communications system, comprising:

detecting a downstream outage;

initiating an acquisition cycle to recover a clock transport quantity from a downstream channel in response to detecting a downstream outage;

determining a first clock difference from a first high bandwidth clock and a first low bandwidth clock, wherein said first high bandwidth clock and said first low bandwidth clock are recovered from said downstream channel using a phase locked loop (PLL);

upon completion of said acquisition cycle, determining a final clock difference from a subsequent high bandwidth clock and a subsequent low bandwidth clock, wherein said subsequent high bandwidth clock and said subsequent low bandwidth clock are recovered from said downstream channel using a PLL;

determining a timing difference from said first clock difference and said final clock difference; and applying said timing difference to correct the timing error.

2. The method according to claim 1, wherein said detecting comprises:

detecting a loss of clock transport information on said downstream channel.

3. The method according to claim 1, further comprising:

determining at least one of said first clock difference and said final clock difference from an up/down counter.

4. The method according to claim 1, wherein said determining a timing difference comprises:

computing a clock drift from said first clock difference and said final clock difference, whereby said clock drift is applied to determine said timing difference.

5. The method according to claim 1, wherein said determining a timing difference comprises:

applying a frequency of a low bandwidth clock to determine said timing difference.

6. The method according to claim 1, wherein said applying comprises:

offsetting an accumulator of a numerically controlled oscillator to correct the timing error.

7. The method according to claim 1, wherein said applying comprises:

correcting symbol timing.

8. The method according to claim 1, wherein said applying comprises:

correcting burst timing.

9. The method of claim 1, wherein the first high bandwidth clock is generated from a high bandwidth phase locked loop (PLL) and the first low bandwidth clock is generated from a low bandwidth PLL.

10. The method of claim 9, further comprising:

upon initiation of the acquisition cycle, opening a loop of the low bandwidth PLL.

11. A method of detecting a timing error within a communications system, comprising:
- determining a first clock difference from a first high bandwidth clock and a first low bandwidth clock, wherein said first high bandwidth clock and said first low bandwidth clock are recovered from a downstream channel using a phase locked loop (PLL);
- determining a second clock difference from a subsequent high bandwidth clock and a subsequent low bandwidth clock, wherein said subsequent high bandwidth clock and said subsequent low bandwidth clock are recovered from said downstream channel using a PLL; and
- detecting an occurrence of a timing error from a magnitude of the difference between said first clock difference and said second clock difference.

12. The method according to claim 11, further comprising: applying said magnitude to correct said timing error.

13. A system for detecting a timing error within a communications system, comprising:
- a receiver configured to recover a clock transport quantity from a downstream channel;
- a high bandwidth phase lock loop communicatively coupled to said receiver and configured to access said clock transport quantity to recover a high bandwidth clock;
- a low bandwidth phase lock loop communicatively coupled to said receiver and configured to access said clock transport quantity to recover a low bandwidth clock; and
- a clock comparator configured to determine a first clock difference from said high bandwidth clock and said low bandwidth clock, a second clock difference from said high bandwidth clock and said low bandwidth clock, and a timing difference from said first clock difference and said second clock difference.

14. The system of claim 13, further comprising:
a processor communicatively coupled to a clock comparator and configured to detect a timing error from an output from said clock comparator.

15. The system of claim 13, further comprising:
a processor configured to determine an offset value from an output from a clock comparator, wherein said offset value is applied to correct a timing error.

16. The system of claim 13, further comprising:
a processor communicatively coupled to said receiver and adapted to initiate an acquisition cycle to recover a clock transport quantity from said downstream channel, wherein said acquisition cycle is initiated in response to a downstream outage.

* * * * *

UNITED STATES PATENT AND TRADEMARK OFFICE
CERTIFICATE OF CORRECTION

PATENT NO. : 7,630,468 B2  Page 1 of 1
APPLICATION NO. : 10/967201
DATED : December 8, 2009
INVENTOR(S) : Miller et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1365 days.

Signed and Sealed this

Second Day of November, 2010

David J. Kappos
*Director of the United States Patent and Trademark Office*